(12) United States Patent  
Watanabe

(10) Patent No.: US 7,650,614 B2  
(45) Date of Patent: Jan. 19, 2010

(54) ELECTRICAL DEVICE CABINET

(75) Inventor: Masakazu Watanabe, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 453 days.

(21) Appl. No.: 11/650,447

(22) Filed: Jan. 8, 2007

(65) Prior Publication Data  
US 2007/0162918 A1 Jul. 12, 2007

(30) Foreign Application Priority Data  
Jan. 10, 2006 (JP) .............................. 2006-002499

(51) Int. Cl.  
*G11B 33/02* (2006.01)

(52) U.S. Cl. ...................................... 720/646
(58) Field of Classification Search ................ 720/646; 361/726  
See application file for complete search history.

(56) References Cited

U.S. PATENT DOCUMENTS

| 5,564,585 | A | * | 10/1996 | Saitoh | 220/241 |
| 5,978,339 | A | * | 11/1999 | Sasaki et al. | 720/646 |
| 6,134,116 | A | * | 10/2000 | Hoss et al. | 361/747 |
| 6,820,951 | B2 | * | 11/2004 | Fukushima et al. | 312/223.2 |
| 6,971,112 | B2 | * | 11/2005 | Inoue et al. | 720/646 |
| 7,057,884 | B2 | * | 6/2006 | Davidson et al. | 361/679.55 |
| 7,082,036 | B2 | * | 7/2006 | Cheng et al. | 361/726 |
| 7,206,197 | B2 | * | 4/2007 | Chen et al. | 361/679.02 |
| 7,236,353 | B2 | * | 6/2007 | Davidson et al. | 361/679.34 |
| 7,278,147 | B2 | * | 10/2007 | Pen | 720/646 |
| 7,428,146 | B2 | * | 9/2008 | Han | 361/679.55 |
| 7,448,702 | B2 | * | 11/2008 | Chen et al. | 312/223.2 |
| 2004/0172641 | A1 | * | 9/2004 | Saito | 720/646 |

FOREIGN PATENT DOCUMENTS

| JP | 06-089559 | 3/1994 |
| JP | 2002-217556 | 8/2002 |
| JP | 2002-324982 | 11/2002 |
| JP | 2005-136040 | 5/2005 |

* cited by examiner

*Primary Examiner*—Mark Blouin  
(74) *Attorney, Agent, or Firm*—Global IP Counselors, LLP

(57) ABSTRACT

An electrical device cabinet includes a cabinet body, a front panel, and a positioning mechanism. The cabinet body has an open front end. The front panel is formed by a resin molding, and is mounted to the front end of the cabinet body. The positioning mechanism includes a concave portion disposed at the cabinet body and a convex portion disposed at an inner face of the front panel. The positioning mechanism positions the front panel in a lateral direction with respect to the cabinet body by mating the concave portion and the convex portion. The convex portion is formed in a hollow shape and is covered by an outer face of the front panel from a front side of the front panel.

5 Claims, 6 Drawing Sheets

ELECTRICAL DEVICE CABINET

CROSS-REFERENCE TO RELATED APPLICATIONS

This application claims priority to Japanese Patent Application No. 2006-002499 filed on Jan. 10, 2006. The entire disclosure of Japanese Patent Application No. 2006-002499 is hereby incorporated herein by reference.

BACKGROUND OF THE INVENTION

1. Field of the Invention

The present invention generally relates to an electrical device cabinet. More specifically, the present invention relates to an electrical device cabinet having a front panel which is a resin molding.

2. Background Information

FIG. 5 is a simplified vertical cross sectional side view of a front panel 105 employed in a known electrical device cabinet. The front panel 105 is equipped with a convex portion 106 used for positioning the front panel 105 in a lateral direction of the electrical device cabinet. The convex portion 106 is provided at a location in a lateral direction of a bottom plate 155 of the front panel 105. The convex portion 106 is solidly formed by increasing a thickness of the bottom plate 155 at the location.

FIG. 6 is a simplified vertical cross sectional side view of another convex portion 116 formed on the front panel 105 employed in another electrical device cabinet. A recess 161 is formed on a lower face side of the bottom plate 155 of the front panel 105 at the location where the convex portion 116 is formed.

A configuration in which an electrical device cabinet is made up of a chassis, a top cover, and a front panel is known (see Japanese Laid-Open Patent Application No. 2002-217556 and Japanese Laid-Open Patent Application No. 2005-136040, for example). The coupling of a front panel and a chassis with an engagement structure is also known (see Japanese Laid-Open Patent Application No. 2002-324982, for example). Furthermore, research into setting a vertical attachment reference place for a front panel with respect to a front panel attachment frame is known (see Japanese Laid-Open Patent Application No. H6-89559, for example).

However, when the convex portion 106 is formed in the way illustrated in FIG. 5, a tiny depression known as a "sink mark" is produced on a lower face 156 of the bottom plate 155 at the location where the convex portion 106 is formed because of shrinkage of the resin molding material. The sink mark becomes a very noticeable flaw in the appearance of the electrical device cabinet.

The occurrence of the above-mentioned sink mark is suppressed if the convex portion 116 is formed in the way illustrated in FIG. 6. Specifically, an increase in the thickness of the front panel 105 at the location of the convex portion 116 is avoided by forming the recess 161. However, since the recess 161 is exposed on an outer face (the lower face) of the front panel 105, the recess 161 becomes a very noticeable flaw in the appearance of the front panel 105 of the electrical device cabinet.

In view of the above, it will be apparent to those skilled in the art from this disclosure that there exists a need for an improved electrical device cabinet that prevents flaws in its outer appearance. This invention addresses this need in the art as well as other needs, which will become apparent to those skilled in the art from this disclosure.

SUMMARY OF THE INVENTION

It is an object of the present invention to provide an electrical device cabinet with a positioning portion that prevents the occurrence of a noticeable sink mark or recess.

The electrical device cabinet according to the first aspect of the present invention is an electrical device cabinet having a cabinet body, a front panel, and a positioning mechanism. The cabinet body has an open front end. The front panel is formed by a resin molding, and is mounted to the front end of the cabinet body. The positioning mechanism includes a concave portion disposed at the cabinet body and a convex portion disposed at an inner face of the front panel. The positioning mechanism positions the front panel in a lateral direction with respect to the cabinet body by mating the concave portion and the convex portion. The convex portion is formed in a hollow shape and is covered by an outer face of the front panel from a front side of the front panel.

Since the convex portion is hollow, the thickness of the front panel at a place where the convex portion is formed is not greater than the thickness of the surrounding area of the place where the convex portion is formed, which suppresses the occurrence of a sink mark. Also, since the convex portion is covered by the outer face of the front panel from the front side, no recess at the place where the convex portion is formed on the outer face of the front panel is formed that would be noticeable to the eye from the front side. With the present invention, noticeable sink marks or recesses adversely affecting the appearance do not arise. Thus, the electrical device cabinet is enhanced aesthetically.

The electrical device cabinet according to a second aspect of the present invention is the electrical device cabinet according to the first aspect of the present invention, wherein a portion of the outer face of the front panel where the convex portion is formed is continuous in the same plane with the outer face of a surrounding area.

The electrical device cabinet according to a third aspect of the present invention is the electrical device cabinet according to the second aspect of the present invention, wherein the convex portion is formed in the hollow shape by forming a recess that opens to a rear side which is an opposite side to the front side.

Since the convex portion is formed in the hollow shape by forming a recess that opens to the rear side, it is possible for the convex portion to be easily and integrally molded by injection molding along with the front panel. In addition, it is possible to minimize an area having greater thickness, so any sink mark that is produced will not be so noticeable as to adversely affect the appearance.

The electrical device cabinet according to a fourth aspect of the present invention is the electrical device cabinet according to the third aspect of the present invention, wherein the convex portion includes a roof section and a plurality of leg sections that are each linked to a lateral end of the roof section. A thickness of each of the leg sections is less than half of a thickness of the front panel where the convex portion is disposed.

The electrical device cabinet according to a fifth aspect of the present invention is the electrical device cabinet according to the fourth aspect of the present invention, wherein the cabinet body includes a chassis having a forward-facing protrusion that overlaps a bottom portion of the front panel, and a top cover fitted with the chassis to form the cabinet body in the form of a box that is longer in the lateral direction. The concave portion is formed in the forward-facing protrusion. The convex portion is provided to the bottom portion.

The electrical device cabinet according to a sixth aspect of the present invention is the electrical device cabinet according to the fifth aspect of the present invention, wherein the convex portion is formed in a substantially rectangular shape in a plan view.

With the electrical device cabinet pertaining to the present invention, no noticeable sink mark is present at the place where the convex portion is formed on the front panel, nor is any noticeable recess present. Therefore, it is possible to prevent noticeable sink marks or recesses from adversely affecting the appearance of the front panel and the electrical device cabinet. Also, the convex portion is integrally formed with the front panel from a resin. Therefore, an electrical device cabinet with a good appearance can be provided inexpensively without having to make major modifications to the shape of the front panel.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

Figure 1:
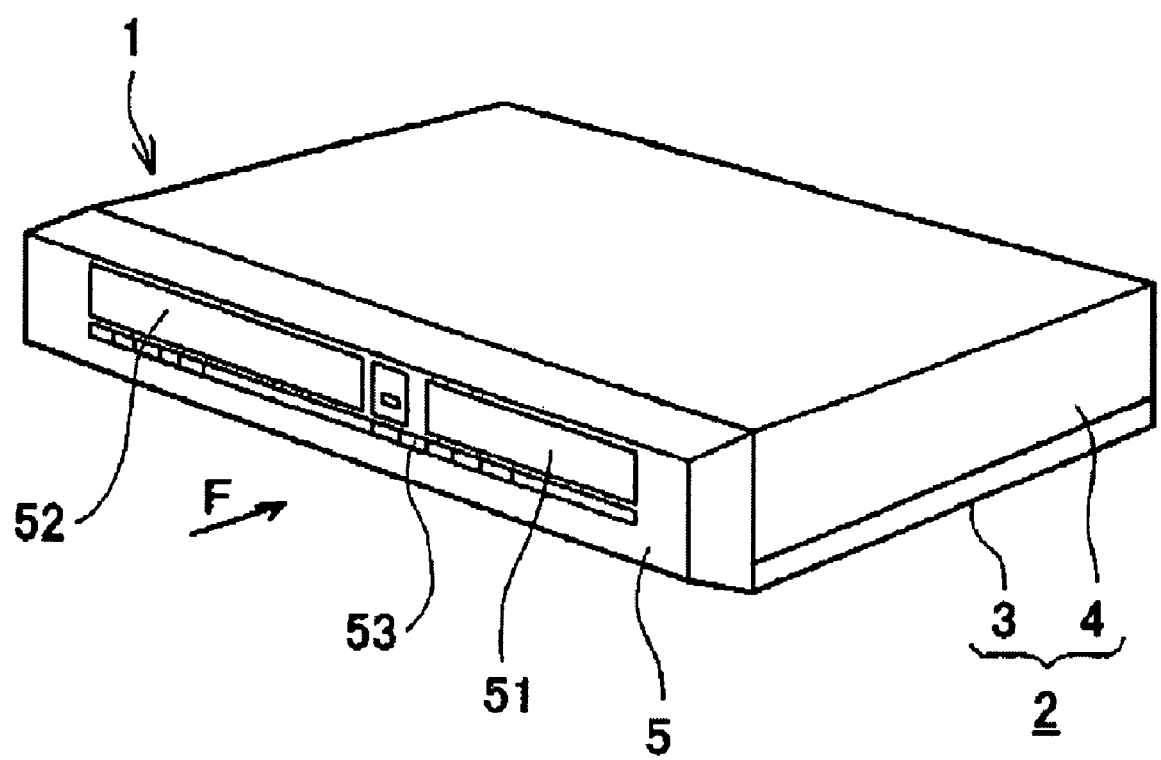
FIG. 1 is an overall oblique view of an electrical device cabinet in accordance with the present invention.

FIG. 1 is an overall oblique view of an electrical device cabinet. The electrical device cabinet 1 (hereinafter "cabinet 1") in FIG. 1 is a cabinet for a multifunction audio-visual device (multifunction AV device) having a built-in magnetic tape device used with tape cassettes such as a video cassette recorder, an optical disk device used with disk-shaped media such as a DVD player or recorder, or the like. The cabinet 1 includes a cabinet body 2 and a front panel 5. The cabinet body 2 includes a chassis 3 and a top cover 4 that is fitted over the chassis 3. The chassis 3 and the top cover 4 are fitted together to form the cabinet body 2 in the form of a box that is longer in a lateral direction W. The cabinet body 2 is in the form of a box having an open front end. The front panel 5 is a resin molding mounted to the open front end of the cabinet body 2. The front panel 5 is equipped with a tray opening 51, a cassette opening 52 and a button pad 53. A tray of the optical disk device moves in and out of the tray opening 51. The cassette opening 52 is configured for inserting or removing a tape cassette into or from the magnetic tape device. The button pad 53 includes various mode setting buttons for the optical disk device or the magnetic tape device, and so forth.

Figure 2:
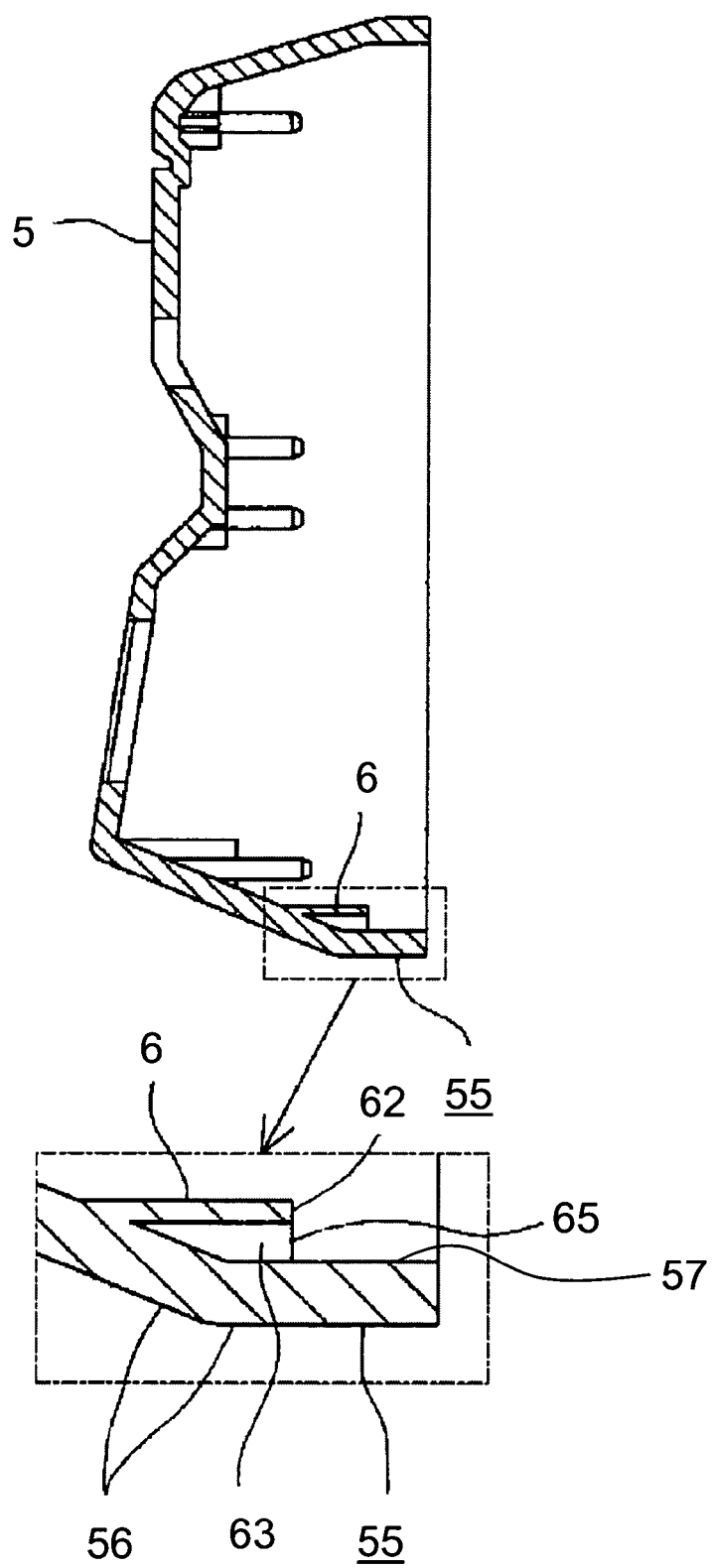
FIG. 2 is a simplified vertical cross sectional side view of a front panel employed in the electrical device cabinet in accordance with the present invention.
Figure 3:
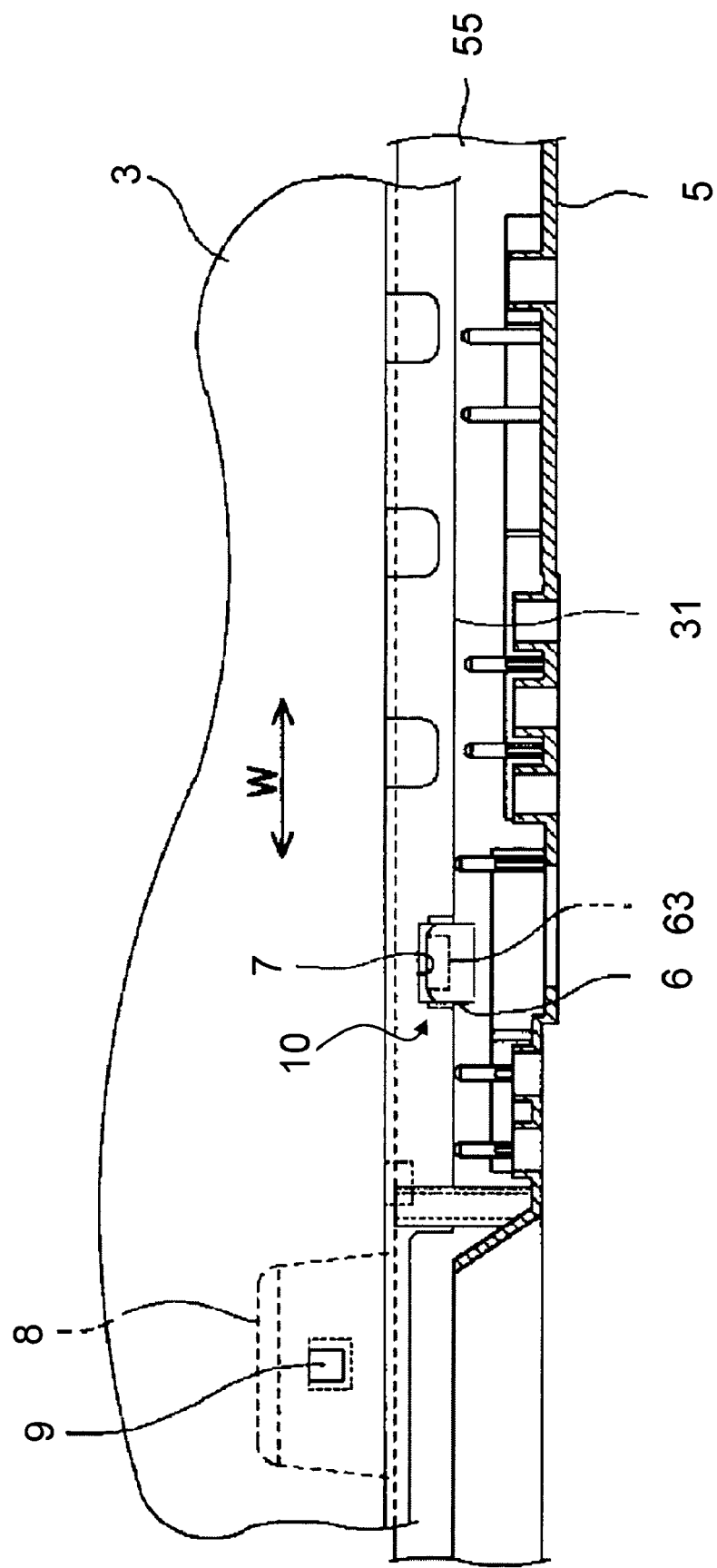
FIG. 3 is a simplified horizontal cross section of a plurality of main components of the electrical device cabinet in accordance with the present invention.
Figure 4:
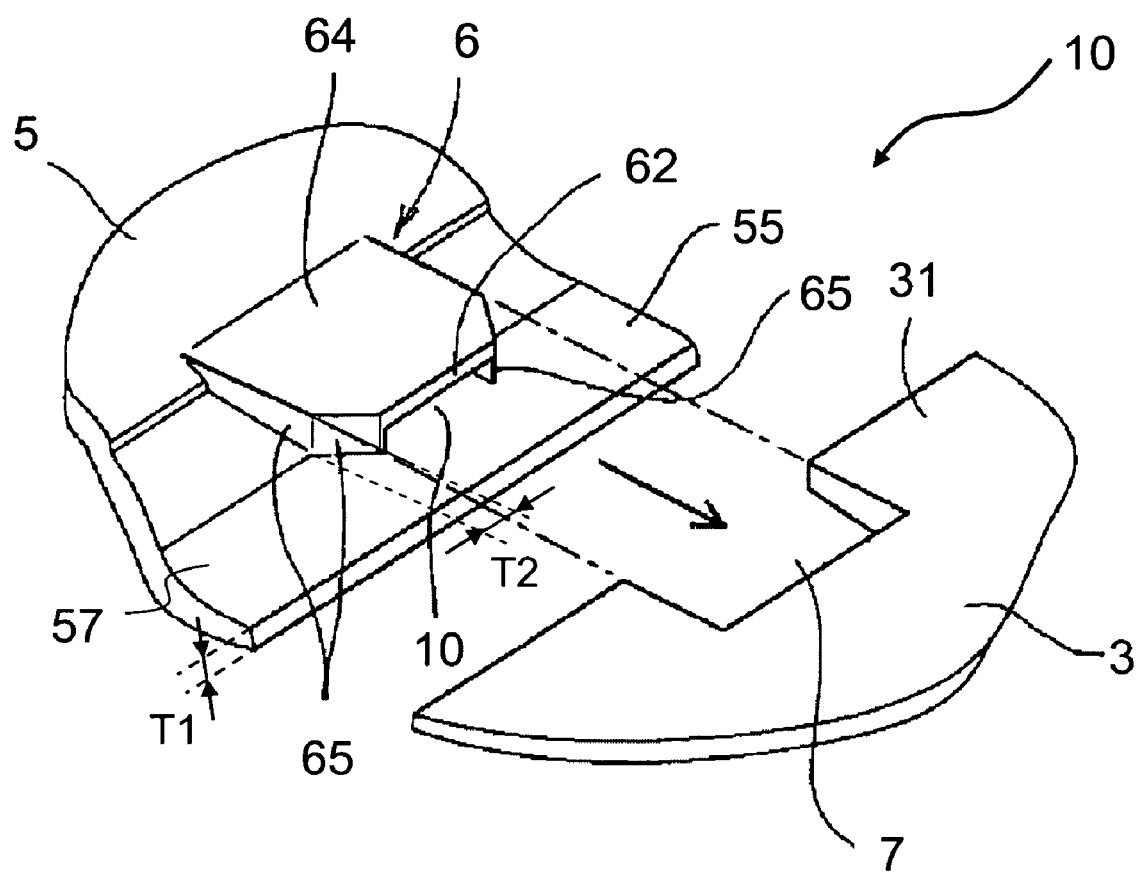
FIG. 4 is a simplified oblique view of a convex portion and a concave portion used for positioning the front panel and a chassis of the electrical device cabinet in accordance with the present invention.
Figure 5:
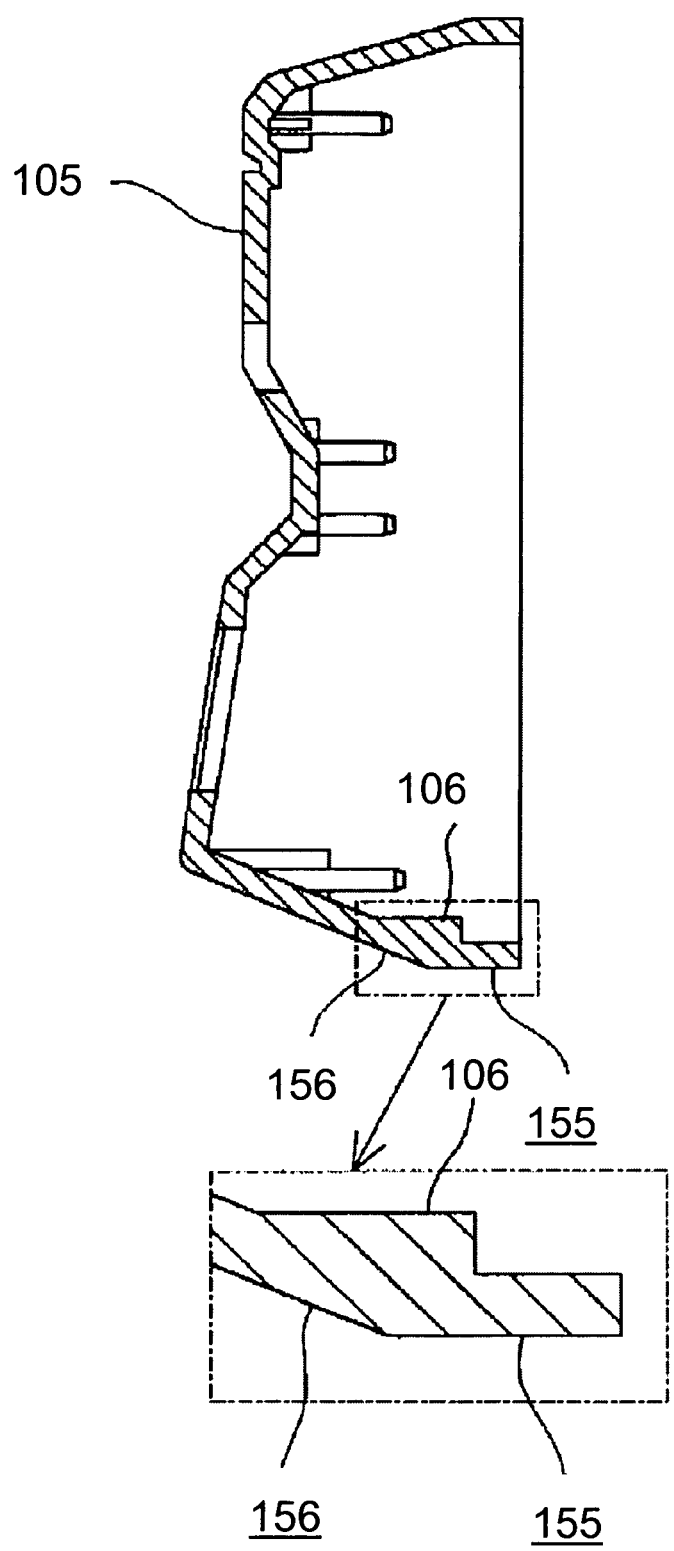
FIG. 5 is a simplified vertical cross sectional side view of a front panel employed in a known electrical device cabinet.
Figure 6:
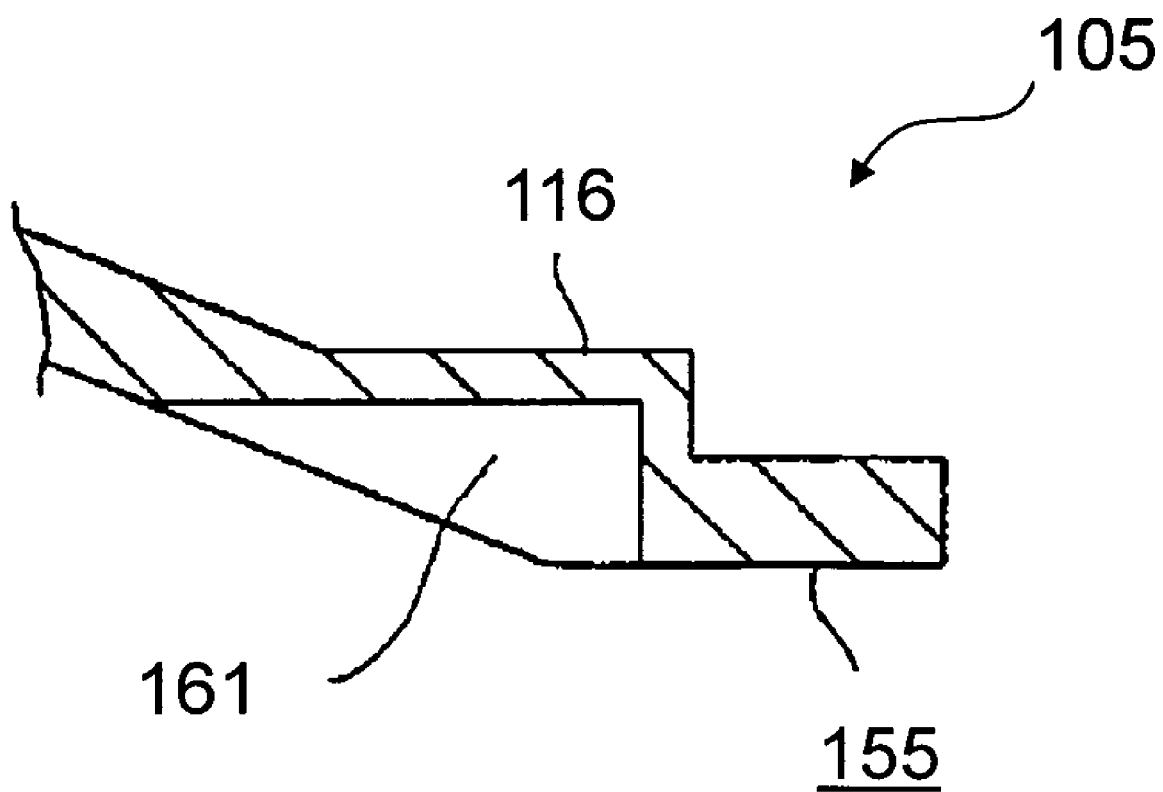
FIG. 6 is a partial vertical cross sectional side view of a convex portion of a known electrical device cabinet.

Referring to FIGS. 2-4, the front panel 5 has a convex portion 6 and a plurality of engagement tabs 8. The convex portion 6 is provided at a location in the lateral direction W on an upper face (or an inner face) 57 of a bottom plate 55 of the front panel 5. The engagement tabs 8 are provided at a plurality of locations of the front panel 5. The chassis 3 includes a forward-facing protrusion 31, a concave portion 7, and a plurality of engagement protrusions 9. The forward-facing protrusion 31 is disposed at a front end of the chassis 3. The concave portion 7 is formed in the forward-facing protrusion 31. The engagement protrusions 9 are provided at a plurality of locations of the chassis 3. The forward-facing protrusion 31 overlaps the bottom plate 55 or bottom portion of the front panel 5. The chassis 3 and the front panel 5 are positioned in the lateral direction W by fitting the convex portion 6 into the concave portion 7. The chassis 3 and the front panel 5 are coupled to each other by engaging the engagement tabs 8 with the engagement protrusions 9. A positioning mechanism 10 for positioning the chassis 3 and the front panel 5 includes the convex portion 6 and the concave portion 7, as illustrated in a magnified view in FIG. 4.

Referring to FIGS. 2-4, the convex portion 6 has a recess 63 that opens at a rearward-facing end face 62 (a rear side) of the convex portion 6. In other words, the convex portion 6 is formed in a hollow shape and is covered at a bottom section by a lower face (or an outer face) 56 of the bottom plate 55 from the front side of the front panel 5. Since the convex portion 6 has the recess 63, as shown in FIG. 4, the convex portion 6 forms a flat gate shape having a roof section 64 that is substantially rectangular in plan view and a plurality of leg sections 65 that are linked to the left and right ends of the roof section 64. A thickness T2 of a leg section 65 in the lateral direction W is less than half of the thickness T1 of the bottom plate 55. At a location where the convex portion 6 is formed, the thickness T1 of the bottom plate 55 is held constant everywhere except at locations where the leg sections 65 are formed. In addition, a portion of the lower face 56 of the bottom plate 55 where the convex portion 6 is formed is continuous in the same plane with the lower face 56 of a surrounding area. Therefore, when the convex portion 6 is integrally molded from resin with the bottom plate 55 of the front panel 5, not only will there be no sink marks attributable to locally occurring areas of greater thickness, but the recess 63 will not be visible from outside the front panel 5. At portions of the bottom plate 55 where the leg sections 65 of the convex portion 6 are formed, the thickness T1 of the bottom plate 55 is increased by an amount corresponding to a height of the leg sections 65. However, the occurrence of sink marks on the lower face 56 of the bottom plate 55 is avoided by keeping the leg sections 65 thin.

As shown in FIG. 4, from a state in which the convex portion 6 on the front panel 5 is across from the concave portion 7 on the chassis 3, the bottom plate 55 of the front panel 5 is pushed toward a lower side of the chassis 3 so that the upper face 57 of the bottom plate 55 overlaps the chassis 3. The convex portion 6 is thus mated with the concave portion 7. As a result, the convex portion 6 is positioned in the concave portion 7 so that the convex portion 6 will not move in the lateral direction W, thereby aligning the chassis 3 and the front panel 5 in the lateral direction W. After the chassis 3 and the front panel 5 are aligned in the lateral direction W, the front panel 5 is coupled to the chassis 3 by engaging the engagement tabs 8 (see FIG. 3) with the engagement protrusions 9 on the chassis 3.

With this embodiment, even when the cabinet 1 is viewed from the front side, as indicated by the arrow F in FIG. 1, the appearance of sink marks or recesses on the outside of the cabinet 1 is prevented. This gives the cabinet 1 a more finished look. Also, the recess 63 of the convex portion 6 was formed so that the recess 63 would be hidden and not visible from the outside, which results in the convex portion 6 being easily integrally molded with the front panel 5. As a result, it is possible to maintain mass productivity of the front panel 5 and the cabinet 1.

GENERAL INTERPRETATION OF TERMS

Terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies. As used herein to describe the present invention, the following directional terms "forward, rearward, above, downward, vertical, horizontal, below and transverse" as well as any other similar directional terms refer to those directions of an electrical device cabinet equipped with the present invention. Accordingly, these terms, as utilized to describe the present invention should be interpreted relative to an electrical device cabinet equipped with the present invention as used in the normal position.

While only a preferred embodiment has been chosen to illustrate the present invention, it will be apparent to those skilled in the art from this disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:
1. An electrical device cabinet, comprising:
a cabinet body having an open front end;
a front panel formed by a resin molding, and mounted to the front end of the cabinet body; and
a positioning mechanism including a concave portion disposed at the cabinet body and a convex portion disposed at an inner face of the front panel, the positioning mechanism positioning the front panel in a lateral direction with respect to the cabinet body by mating the concave portion and the convex portion,
the convex portion being formed in a hollow shape and covered by an outer face of the front panel from a front side of the front panel, the convex portion including a surrounding portion that defines a recess within the surrounding portion with the recess opening to a rear side of the front panel that is an opposite side of the front side, the surrounding portion and the recess being disposed within the concave portion.

2. The electrical device cabinet according to claim 1, wherein
a portion of the outer face of the front panel where the convex portion is formed is continuous in the same plane with the outer face of a surrounding area.

3. The electrical device cabinet according to claim 2, wherein
the convex portion includes a roof section and a plurality of leg sections that are each linked to a lateral end of the roof section, and
a thickness of each of the leg sections is less than half of a thickness of the front panel where the convex portion is disposed.

4. The electrical device cabinet according to claim 3, wherein
the cabinet body includes a chassis having a forward-facing protrusion that overlaps a bottom portion of the front panel, and a top cover fitted with the chassis to form the cabinet body in the form of a box that is longer in the lateral direction,
the concave portion is formed in the forward-facing protrusion, and
the convex portion is provided at the bottom portion.

5. The electrical device cabinet according to claim 4, wherein
the convex portion is formed in a substantially rectangular shape in a plan view.

* * * * *